(12) United States Patent
Baskaran et al.

(10) Patent No.: US 9,646,972 B2
(45) Date of Patent: May 9, 2017

(54) METHODS OF FORMING BURIED VERTICAL CAPACITORS AND STRUCTURES FORMED THEREBY

(71) Applicants: Rajashree Baskaran, Seattle, WA (US); Kimin Jun, Hillsboro, OR (US); Patrick Morrow, Portland, OR (US)

(72) Inventors: Rajashree Baskaran, Seattle, WA (US); Kimin Jun, Hillsboro, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/912,402

(22) PCT Filed: Sep. 25, 2013

(86) PCT No.: PCT/US2013/061538
§ 371 (c)(1),
(2) Date: Feb. 16, 2016

(87) PCT Pub. No.: WO2015/047233
PCT Pub. Date: Apr. 2, 2015

(65) Prior Publication Data
US 2016/0204110 A1    Jul. 14, 2016

(51) Int. Cl.
*H01L 27/108*     (2006.01)
*H01L 49/02*      (2006.01)
*H01L 27/06*      (2006.01)

(52) U.S. Cl.
CPC .... *H01L 27/10832* (2013.01); *H01L 27/0629* (2013.01); *H01L 27/0688* (2013.01);
(Continued)

(58) Field of Classification Search
CPC ............... H01L 27/10832; H01L 28/91; H01L 27/10867; H01L 28/87; H01L 28/20; H01L 27/1087
See application file for complete search history.

(56) References Cited

U.S. PATENT DOCUMENTS 4,890,144 A * 12/1989 Teng ................... H01L 27/0629
                                                              257/331
4,905,065 A    2/1990 Selcuk et al.
(Continued)

FOREIGN PATENT DOCUMENTS

TW    I259559    8/2006
TW    I329080    4/2013

OTHER PUBLICATIONS

Office Action including Search Report issued by the Examiner of the Taiwan Intellectual Property Office (the IPO) dated Mar. 16, 2016 for Taiwan Patent Application No. 103133289 and English Translation thereof.
(Continued)

*Primary Examiner* — William Coleman
(74) *Attorney, Agent, or Firm* — Blakely, Sokoloff, Taylor & Zafman LLP

(57)    ABSTRACT

Methods of forming passive elements under a device layer are described. Those methods and structures may include forming at least one passive structure, such as a capacitor and a resistor structure, in a substrate, wherein the passive structures are vertically disposed within the substrate. An insulator layer is formed on a top surface of the passive structure, a device layer is formed on the insulator layer, and a contact is formed to couple a device disposed in the device layer to the at least one passive structure.

22 Claims, 13 Drawing Sheets

(52) U.S. Cl.
CPC .... *H01L 27/1087* (2013.01); *H01L 27/10867* (2013.01); *H01L 28/20* (2013.01); *H01L 28/87* (2013.01); *H01L 28/91* (2013.01)

(56) References Cited

U.S. PATENT DOCUMENTS

| | | | | |
|---|---|---|---|---|
| 5,119,155 A * | 6/1992 | Hieda | ............... | H01L 27/10829 257/304 |
| 5,410,509 A * | 4/1995 | Morita | ................. | G11C 11/404 257/E27.085 |
| 6,010,939 A | 1/2000 | Bothra | | |
| 6,251,740 B1 * | 6/2001 | Johnson | ............ | H01L 21/76838 257/E21.008 |
| 6,815,751 B2 * | 11/2004 | Brown | ............... | H01L 27/1203 257/301 |
| 7,109,543 B2 * | 9/2006 | Park | ................. | H01L 27/10832 257/301 |
| 7,276,751 B2 * | 10/2007 | Ho | .......................... | H01L 28/91 257/296 |
| 7,335,553 B2 * | 2/2008 | Su | ....................... | H01L 27/1087 257/E21.396 |
| 7,459,743 B2 * | 12/2008 | Mandelman | .......... | H01L 27/108 257/300 |
| 7,560,761 B2 | 7/2009 | Cheng et al. | | |
| 7,633,110 B2 * | 12/2009 | Chi | ................... | H01L 27/10805 257/301 |
| 8,188,528 B2 * | 5/2012 | Pei | ......................... | H01L 21/84 257/301 |
| 8,492,818 B2 * | 7/2013 | Wong | ................ | H01L 27/10861 257/301 |
| 9,059,322 B2 * | 6/2015 | Barth, Jr. | ................ | H01L 21/84 |
| 9,178,080 B2 * | 11/2015 | Kalnitsky | ............. | H01L 29/945 |
| 9,349,789 B1 * | 5/2016 | Vega | ...................... | H01L 28/91 |
| 2002/0190298 A1 * | 12/2002 | Alsmeier | .......... | H01L 27/10867 257/301 |
| 2005/0079680 A1 | 4/2005 | Chen | | |
| 2005/0176211 A1 * | 8/2005 | Fukuzaki | ................ | H01L 21/84 438/386 |
| 2006/0275982 A1 | 12/2006 | Fukuzaki et al. | | |
| 2008/0160713 A1 * | 7/2008 | Cheng | ................ | H01L 27/0733 438/386 |
| 2009/0194844 A1 | 8/2009 | Richter | | |
| 2009/0267186 A1 | 10/2009 | Cheng et al. | | |

OTHER PUBLICATIONS

Notification of Transmittal of the International Search Report and the Written Opinion of the International Searching Authority for PCT/US2013/061538 filed Sep. 25, 2013, mailing date Jun. 26, 2014, 19 pages.

* cited by examiner

METHODS OF FORMING BURIED VERTICAL CAPACITORS AND STRUCTURES FORMED THEREBY

This patent application is a U.S. National Phase Application under 35 U.S.C. 371 of International Application No. PCT/US2013/061538 filed Sep. 25, 2013.

BACKGROUND OF THE INVENTION

As microelectronic technology advances for higher performance, integration of high performance passive elements within a device, such as capacitors, becomes increasingly important. Metal on insulator (MIM) capacitors have been implemented within back end device layer processing schemes. However, such back end implementation may be limited due to such factors as die size shrinkage and RC delay limits.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
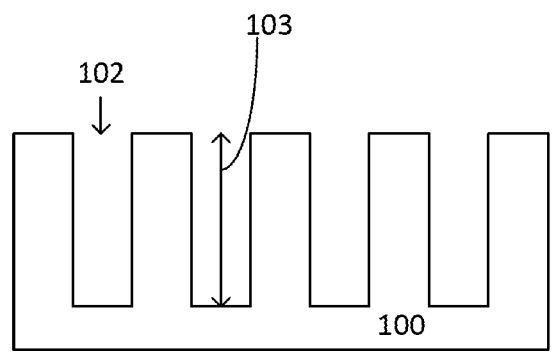
FIGS. 1a-1q represent cross-sectional views of structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as passive elements formed below the device layer are described. Those methods/structures may include forming at least one capacitor structure in a substrate, wherein the capacitor structures are vertically disposed within the substrate, forming an insulator layer on a top surface of the capacitor structure, forming a device layer on the insulator layer; and forming a contact to couple a device disposed in the device layer to the at least one capacitor structure. The embodiments herein enable capacitor arrays to be formed in the substrate below the device layer. These capacitor arrays may be connected to the device layer by the use of contacts which bridge through a thin insulator, which is located between the device layer and the substrate below. The capacitor embodiments herein increase available capacitance for device applications, as well as reduce RC delay.

Figure 1B:
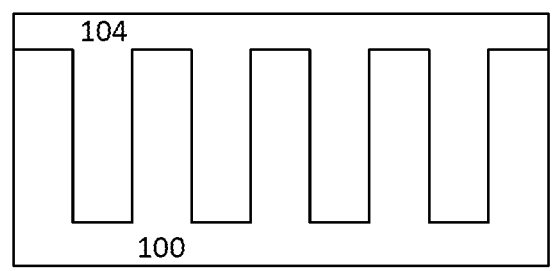
Figure 1C:
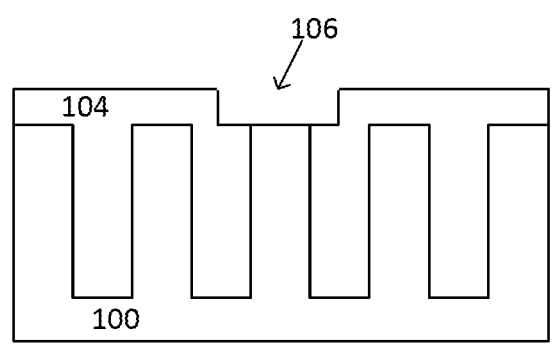
Figure 1D:
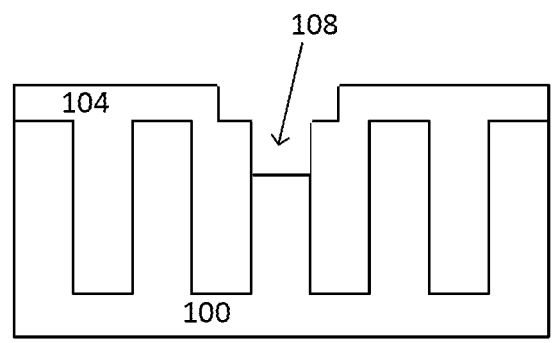
Figure 1E:
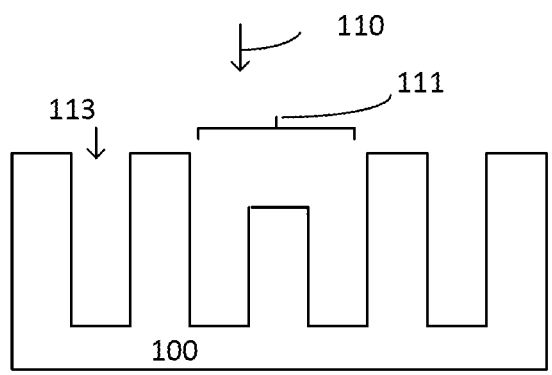
Figure 1F:
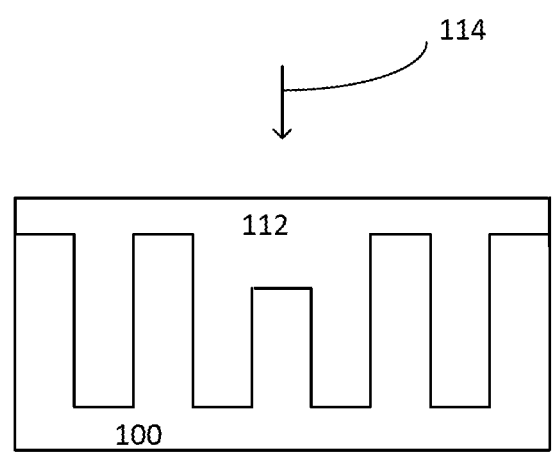
Figure 1G:
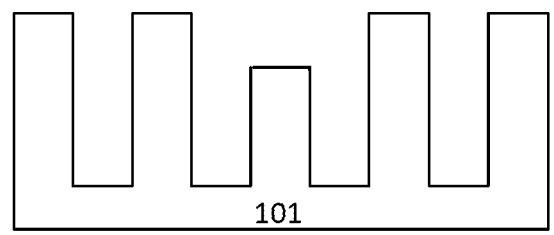
Figure 1H:
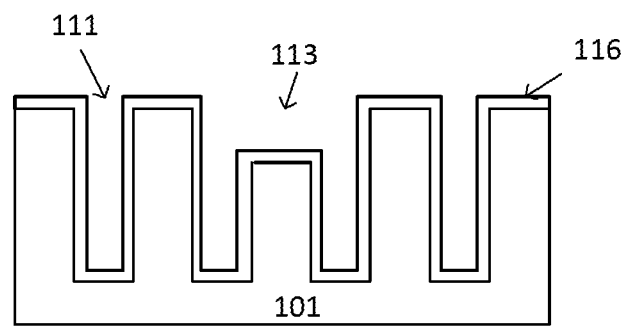
Figure 1I:
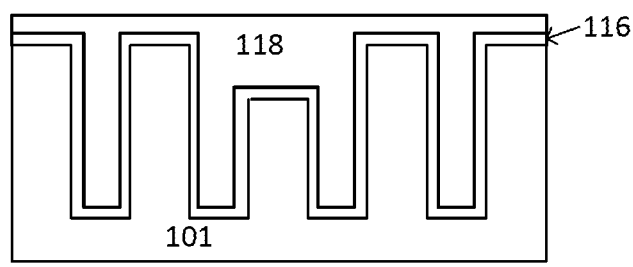
Figure 1J:
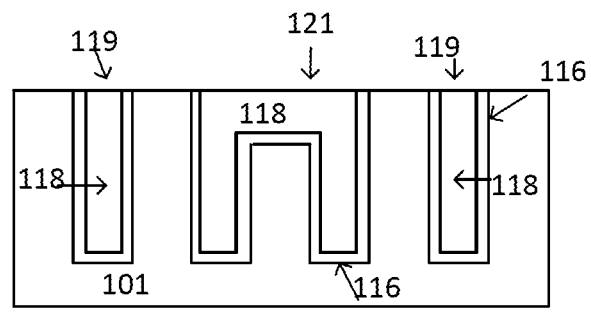
Figure 1K:
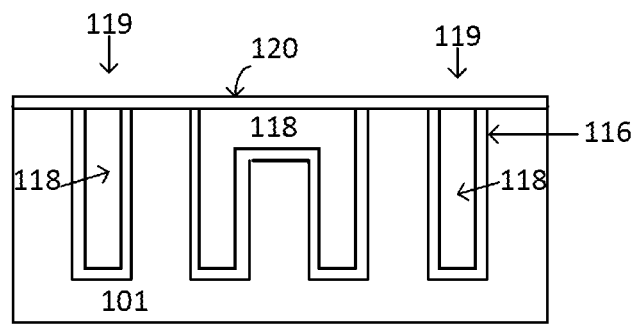
Figure 1L:
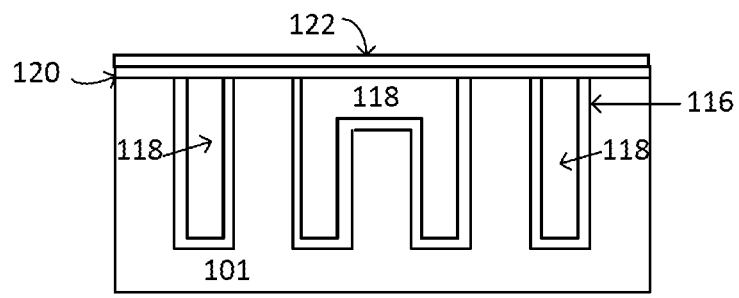
Figure 1M:
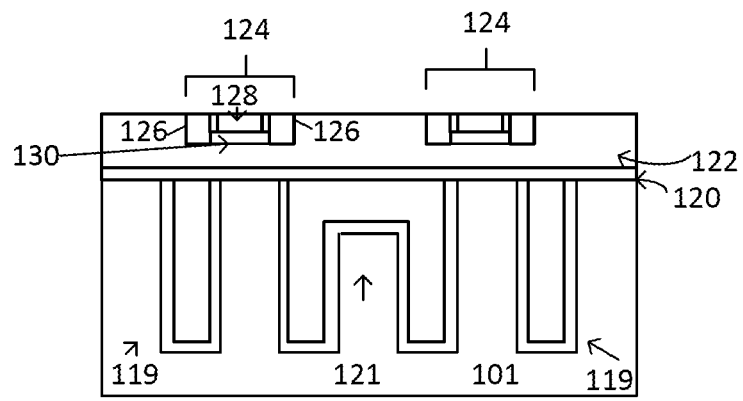
Figure 1N:
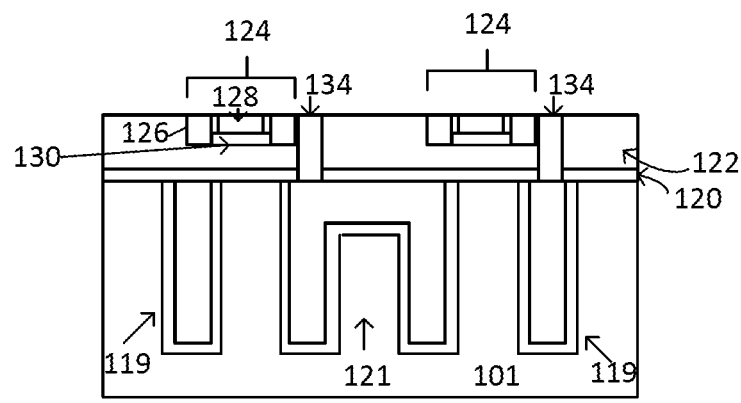
Figure 1O:
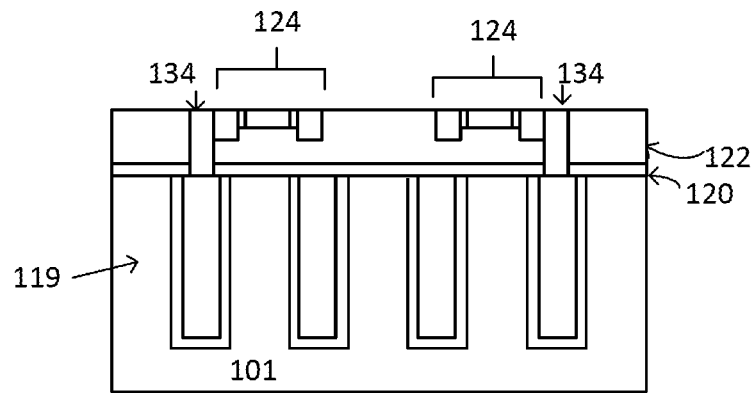
Figure 1P:
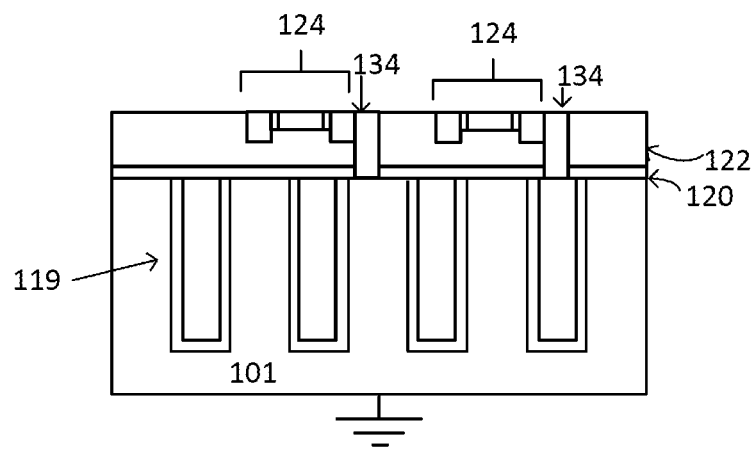
Figure 1Q:
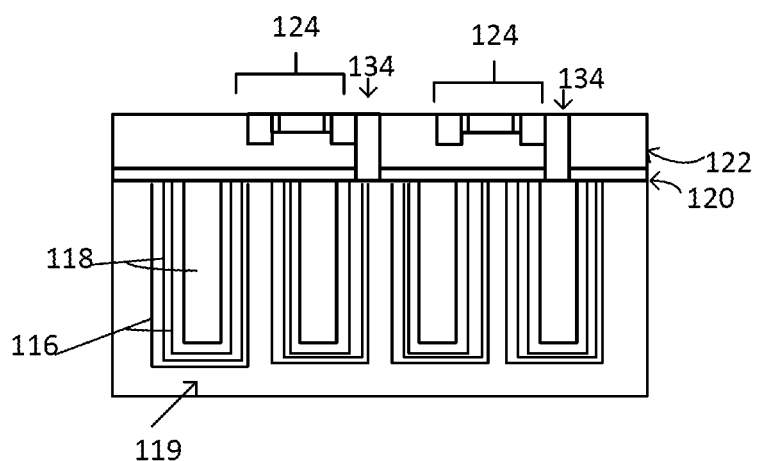

FIGS. 1a-1q illustrate cross-sectional views of embodiments of forming microelectronic structures, such as vertical capacitor arrays buried under devices, such an array of vertical capacitors buried under a silicon on insulator (SOI) substrate. In an embodiment, a substrate 100 may comprise any suitable material with which to form vertical array of capacitors (FIG. 1a). In an embodiment, the substrate 100 may comprise at least one of a silicon material, a non-silicon material, a single crystal silicon material, a polysilicon material, a piezoelectric material, III-V material and/or other electromechanical substrate material. In an embodiment, the substrate may comprise a thin III-V, III-N, and/or a germanium layer. In an embodiment, the substrate 100 does not comprise non-passive elements, such as transistor elements. In an embodiment, the substrate 200 comprises a portion of a silicon wafer.

Openings 102 may be formed in the substrate 100. The openings 102 may comprise deep holes/trenches 102, and may comprise an array of vertical trenches 102. In an embodiment, the at least on opening 102 may comprise a depth 103 of at least about 5 microns, and in some cases, may comprise a depth 103 of between about 5 microns to about 40 microns. The opening 102 may be formed using lithographic and etching processes as suitable for the particular application.

A sacrificial material 104 may be formed in the at least one opening 102 (FIG. 1b). The sacrificial material 104 may comprise a photoresist material in some embodiments, but any suitable material that may be later removed from the opening may be used. The sacrificial material 104 may be patterned and etched to form connection openings 106, 108 in an embodiment (FIGS. 1c-1d). The sacrificial material 104 may then be removed utilizing a removal process 110, such as a dry and/or wet etch process 110, wherein a merged capacitor opening 111 may be formed (FIG. 1e). In other embodiments, only non-merged, single capacitor openings 113 may be formed.

The merged capacitor openings 111 may serve to provide a merging of two adjacent vertical capacitors, to be described subsequently herein. The merged capacitor opening 111 may be formed such that two or more adjacent single capacitor openings 113 may be merged together, such that there is a sharing of a conductor material to be formed subsequently between two or more adjacent vertical capacitor structures.

In an embodiment, a dielectric material 112, such as a borosilicate glass (BSG) material 112 may be formed in the vertical capacitor openings 111, 113 by the use of a formation process, such as an oxidation process, for example (FIG. 1f). The dielectric material 112 may serve to dope the substrate 100 with a dopant, such as a boron material in the case of the BSG material. Other dopant materials are possible, depending upon the particular application. The dopant may be distributed within the substrate 100 by the use of an anneal process 114. The time and temperature of the anneal process 114 may vary depending upon the particular application, but for a BSG material a process may comprise between about 900 and about 1000 degrees Celsius, and may comprise a thickness of about 30 minutes, in some cases. The dopant distribution throughout the substrate 100 may vary according to the particular design.

The dielectric material 112 may be removed and a doped substrate 101 may remain which may comprise a conductive substrate 101 (FIG. 1g). The doped, conductive substrate 101 may comprise the dopant from the dielectric material 112, which may comprise boron in the case of BSG, but may comprise other dopants depending upon the particular application. A capacitor dielectric material 116 may be formed/may line the vertical capacitor openings 111, 113 (FIG. 1h). The capacitor dielectric 116 may comprise an oxide material in an embodiment, but may comprise other dielectrics in some cases.

A conductive material 118, which may comprise an electrode material 118, may be formed on the capacitor dielectric material 116 that is disposed in the vertical capacitor openings 111, 113 (FIG. 1i). The conductive material 118, which may comprise any suitable conductive material such as tungsten, may form within the vertical capacitor openings 111, 113 and may comprise an electrode material 118. The conductive material 118 may be planarized (FIG. 1j). The conductive material 118 may comprise a portion of a vertical capacitor 119, 121 (wherein a single vertical capacitor 119 is not merged with an adjacent vertical capacitor, as in the case of the merged capacitor 121). The vertical capacitors 119, 121 further comprise the capacitor dielectric 116 which separates the capacitor material (electrode) 118 from the conductive substrate 101, wherein the conductive substrate 101 acts as a conductive capacitor electrode for the vertical capacitor 119, 121.

An insulator material 120 may be formed on a top portion of the planarized conductive layer 118 and on a top portion of the conductive substrate 101 (FIG. 1k). The insulator material 120 may comprise a dielectric material, such as but not limited to an oxide material. In an embodiment, the insulator material 120 may comprise a thickness of between about 50 nm to about 100 nm. In an embodiment, a device layer 122 may be formed on the insulator material 120 (FIG. 1l). In an embodiment the device layer 122 may be formed/placed on the insulator material 120 by using a layer transfer process, such as by utilizing one of a Smart-Cut™, ELTRAN and controlled spalling. Thin film processing may also be employed to form the device layer 122.

In an embodiment, the device layer 122 may comprise circuitry elements such as transistor structures including trigate and nanowire transistor structures, and any other suitable circuitry elements. The circuitry elements may comprise logic circuitry for use in a processor die, for example. Metallization layers and insulative material may be included in the device layer 126, as well as conductive contacts/bumps that may couple metal layers/interconnects to external devices. FIG. 1m depicts the device layer 122 comprising at least one transistor device 124 disposed in the device layer 122, in an embodiment. The at least one transistor device 124 may comprise a source/drain 126, gate dielectric 130 and a gate 128, and in some embodiments may comprise one of a planar, a nanowire and a trigate transistor device. The type of transistor devices 124 disposed in the device layer 122 may comprise any suitable type of transistor device 124, according to the particular application.

In an embodiment, at least one contact 134 may be formed adjacent the transistor device 124 (FIG. 1n). The contact 134 may comprise a conductive material, such as tungsten for example. In an embodiment, the contact 134 may be formed through the device layer 122 and the insulator layer 120 to contact at least one of the conductive material 118 of the single vertical capacitor structures 119 and the merged vertical capacitor structures 121.

Figure 5:
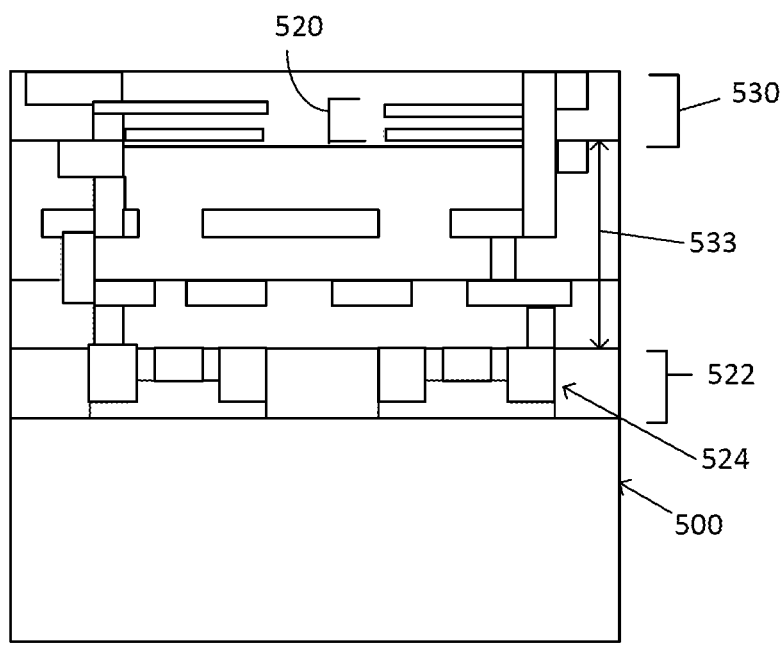
FIG. 5 represents a cross-sectional view of a structure according to the Prior Art.

In an embodiment, one of the source drain portions 126 of the transistor device 124 may be in physical contact/conductively coupled with the one end of the contact 134, and the other end of the contact 134 may be in contact with the vertical capacitor (single or merged). In an embodiment, the merged vertical capacitor structure 121 may increase the amount of capacitance of the vertical capacitor array disposed within the substrate 101. In an embodiment, the substrate 101 may comprise an array of primarily vertical, non-merged capacitors 119 (FIG. 1o). Prior art metal insulator metal (MIM) capacitors 520 (FIG. 5, Prior Art), are typically located in the upper backend region 530 of the device layer 522, and are not located below the device 522 layer in the substrate 500, as in the embodiments herein. The routing distance 533 between capacitor 520 and device 524 in the prior art tend to cause large RC delays. Also, congestion in the back end area of the device layer, as well as die size shrinkage, tends to limit capacitance availability for a prior art device, whereas the embodiments herein greatly increase capacitor supply and reduce RC delay.

In another embodiment the conductive substrate 101 may comprise a ground electrode, wherein one end of the contact 134 may be coupled with the conductive substrate directly 101, and wherein the other end of the contact may be coupled with a device, such as the transistor, of the device layer (referring back to FIG. 1p). In another embodiment, the array of vertical capacitors 119 may comprise multi-layers of capacitor dielectric 116 alternated with capacitor conductive material 118 (FIG. 1q). The number of layers in the multi-layer embodiment of FIG. 1q, and the number of vertical capacitors merged together (as in FIG. 1m, for example) may vary depending upon the particular application.

FIGS. 2a-2k depict cross-sectional views of embodiments of forming resistor structures in a substrate disposed below a device layer, wherein the resistors are understood to be located in a first region of a microelectronic structure, and the device layer is located in a second region of the microelectronic structure, wherein the first region is opposite the second region. In an embodiment, a substrate 200 may comprise a bulk material with which to form passive structures, such as capacitors and resistors. The substrate 200 does not typically comprise non-passive elements, and is located below a device layer. In an embodiment, the substrate 200 may comprise at least one of a silicon, a non-silicon material, a single crystal silicon material, a polysilicon material, a piezoelectric material, III-V material and/or other electromechanical substrate material.

Openings 202 may be formed in the substrate 200. The openings 202 may comprise deep holes/trenches 202, and may comprise an array of vertical trenches 202. In an embodiment, the at least on opening 202 may comprise a depth 203 of at least about 5 microns, and in some cases, may comprise a depth 203 of between about 5 microns to about 40 microns. The opening 202 may be formed using lithographic and etching processes as suitable for the particular application.

Figure 2A:
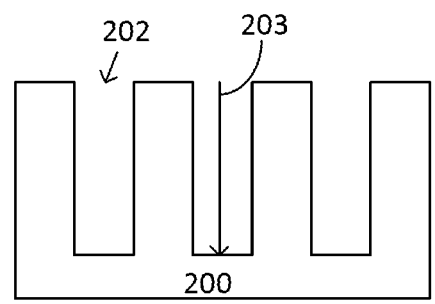
FIGS. 2a-2k represent cross-sectional views of structures according to embodiments.
Figure 2B:
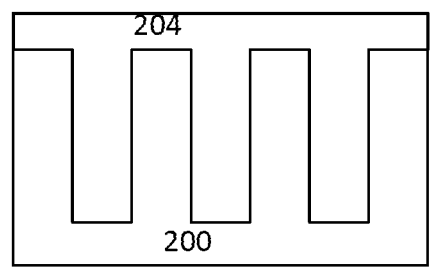
Figure 2C:
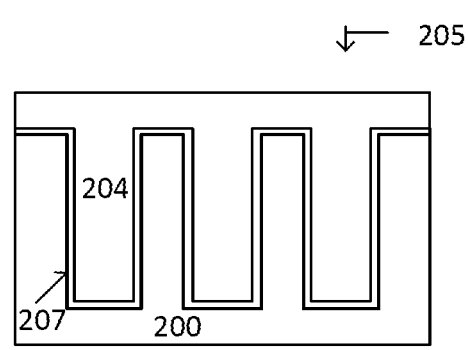

In an embodiment, a dielectric material 204, such as a borosilicate glass (BSG) material 204 may be formed in the vertical capacitor openings 102 by the use of a formation process, such as an oxidation process, for example (FIG. 2b). The dielectric material 204 may serve to dope the substrate 200 with a dopant, such as a boron material in the case of the BSG material. Other dopant materials are possible, depending upon the particular application. The dopant may be distributed within the substrate 200 by the use of an anneal process 205 (FIG. 2c). The time and temperature of the anneal process 205 may vary depending upon the particular application, but for a BSG material a process may comprise between about x temp and about y time, in some cases. A doped region 207 may be formed wherein the amount of dopant is greater than outside of the doped region 207, such as in the relatively undoped substrate 200. The amount of dopant and dopant profile may vary depending upon the particular application.

Figure 2D:
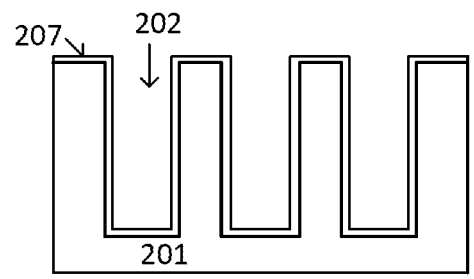

The dielectric material 204 may be removed (FIG. 2d). The doped, conductive substrate 201 may comprise the dopant from the dielectric material 204, which may comprise boron in the case of BSG, but may comprise other dopants depending upon the particular application.

Figure 2E:
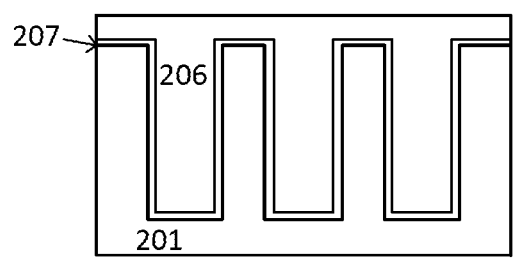
Figure 2F:
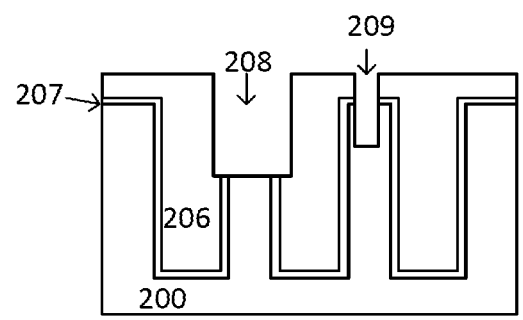

A sacrificial material 206 may be formed in the at least one opening 202 (FIG. 2e). The sacrificial material 206 may comprise a photoresist material in some embodiments, but any suitable material that may be later removed from the opening may be used. The sacrificial material 206 may be patterned and etched to form vertical merged capacitor openings 208 and/or single vertical capacitor openings and resistor opening 209 in an embodiment (FIG. 2f). In some embodiments, single, non-merged capacitor openings may be formed instead of or in addition to the merged capacitor opening 208.

Figure 2G:
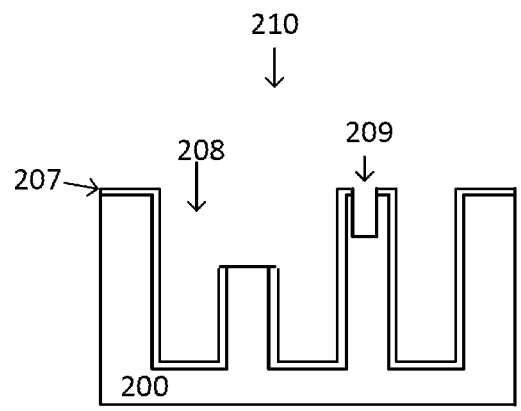

The sacrificial material 204 may then be removed utilizing a removal process 210, such as a dry and/or wet etch process 210, leaving a merged capacitor opening 208 and a resistor opening 209 (FIG. 2g). In another embodiment, primarily non-merged, single capacitor openings may be formed (similar to the vertical capacitors in FIG. 10, for example) in addition to the resistor opening 209. The number of merged, single and resistor openings may vary depending upon the particular application.

Figure 2H:
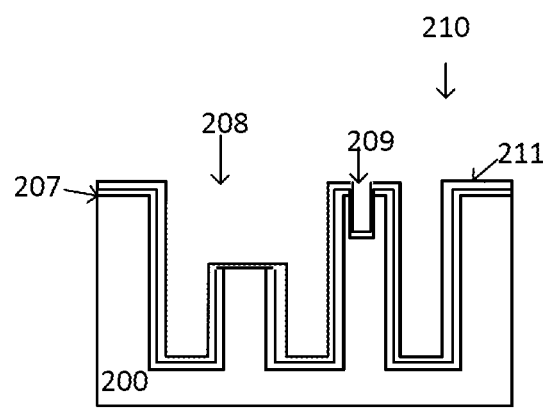
Figure 2I:
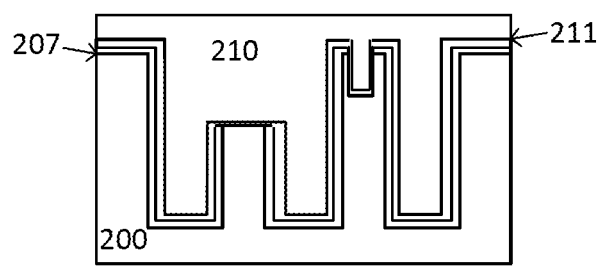

A capacitor dielectric material 211 may be formed/may line the capacitor opening 208 and the resistor opening 209 (FIG. 2h). A conductive material 210, which may comprise an electrode material 210, may be formed on the capacitor dielectric material 211 that is disposed in the capacitor opening 208 and resistor opening 209 (FIG. 2i). The conductive material 210, which may comprise any suitable conductive material such as tungsten, (please add), may comprise an electrode material for the vertical capacitor, and resistor material for the resistor. In some embodiments, the conductive material 210 may be the same for the vertical capacitor and the resistor, and in other embodiments, the conductive material 210 may be different than the resistor material, wherein a separate resistor material may be formed in the resistor opening 209. In an embodiment, when the capacitor electrode material 210 is different from one the resistor material, additional patterning, deposition and etching steps may be required, according to the particular application.

Figure 2J:
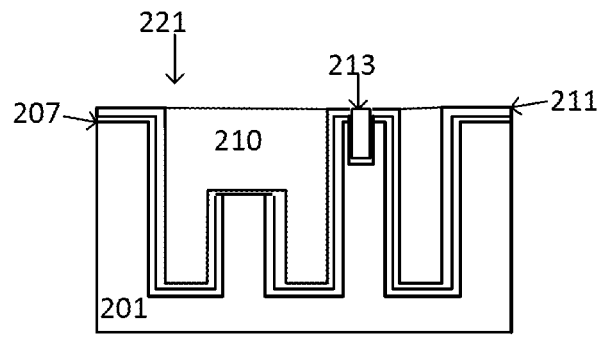

The conductive material 210 may be planarized (FIG. 2j). The conductive material 210 may comprise a portion of a vertical capacitor 221 and may also comprise a portion of a vertical resistor 213 (wherein a merged vertical capacitor is depicted). The vertical capacitor 221 may further comprise the capacitor dielectric 207 which separates the conductive material (electrode) 210 from the conductive substrate 201, wherein the conductive substrate 201 acts as a conductive substrate electrode for the vertical capacitor 221.

Figure 2K:
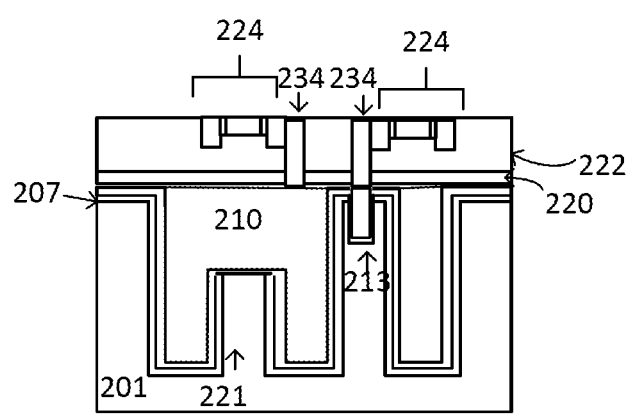

In an embodiment, the vertical resistor 213 may comprise a greater degree of precision than prior art resistors. In FIG. 2k, an insulator layer 220 may be formed on a top portion of the capacitor 221 and a top portion of the resistor 213, and on a top portion of the substrate 201, when single vertical capacitors are formed (as in FIG. 10, for example). A device layer 222 may be formed on the insulator layer 220, wherein contacts 234 may be formed adjacent devices 224, such as transistor 224 devices. The contacts 234 may couple the devices 224 through the insulator layer 220 to contact the conductive material of the top portions of the vertical capacitors 221 and the resistor material of the top portion of the resistor 213.

In an embodiment, the vertical capacitors and transistors of the embodiments herein, such as the vertical capacitors of FIGS. 1o and the vertical resistors of FIG. 2k, may be further comprise a portion of a package structure, such as an organic core package, a 3D device, and a coreless, bumpless build up layer (BBUL) package structure.

In an embodiment, the device layers of the embodiments may be coupled with any suitable type of package structures capable of providing electrical communications between a microelectronic device, such as a die and a next-level component to which the package structures may be coupled (e.g., a circuit board). In another embodiment, the device layers may be coupled with a package structure that may comprise any suitable type of package structures capable of providing electrical communication between a die and an upper integrated circuit (IC) package coupled with the device layer.

A device layer described in the various Figures herein may comprise a silicon logic die or a memory die, for example, or any type of suitable microelectronic device/die. In some embodiments the device layer may further comprise a plurality of dies, which may be stacked upon one another, depending upon the particular embodiment. In some cases the die(s) of the device layer may be located/attached/embedded on either the front side, back side or on/in some combination of the front and back sides of a package structure. In an embodiment, the die(s) may be partially or fully embedded in a package structure of the embodiments.

The various embodiments of the buried passive elements structures included herein enable the use of vertical capacitor arrays in the substrate below the device area and allow for a reduction in RC delay for the embodiments herein. Much of the entire die below a device layer may be utilized for passive elements, such as the capacitors and resistors herein. Since the physical distance is shorter between transistors and passives in the embodiments, the structures according to embodiments herein enable high performance applications. Through contact are formed between transistor contacts and capacitors/transistors through the insulator layer, so that the entire substrate layer, in some cases, may be used for capacitors and other passive elements. Since the openings are very deep without interfering with device layer processing, significant amounts of capacitance can be supplied by the embodiments herein. Additionally, since the through contacts are only insulator deep, minimal RC delay enables high performance applications, such as mobile applications and radio frequency integrated circuit (RFIC) applications. Equivalent series resistance (ESR) of the embodiments is much lower than for prior art back end MIM's (see FIG. 5).

Figure 3:
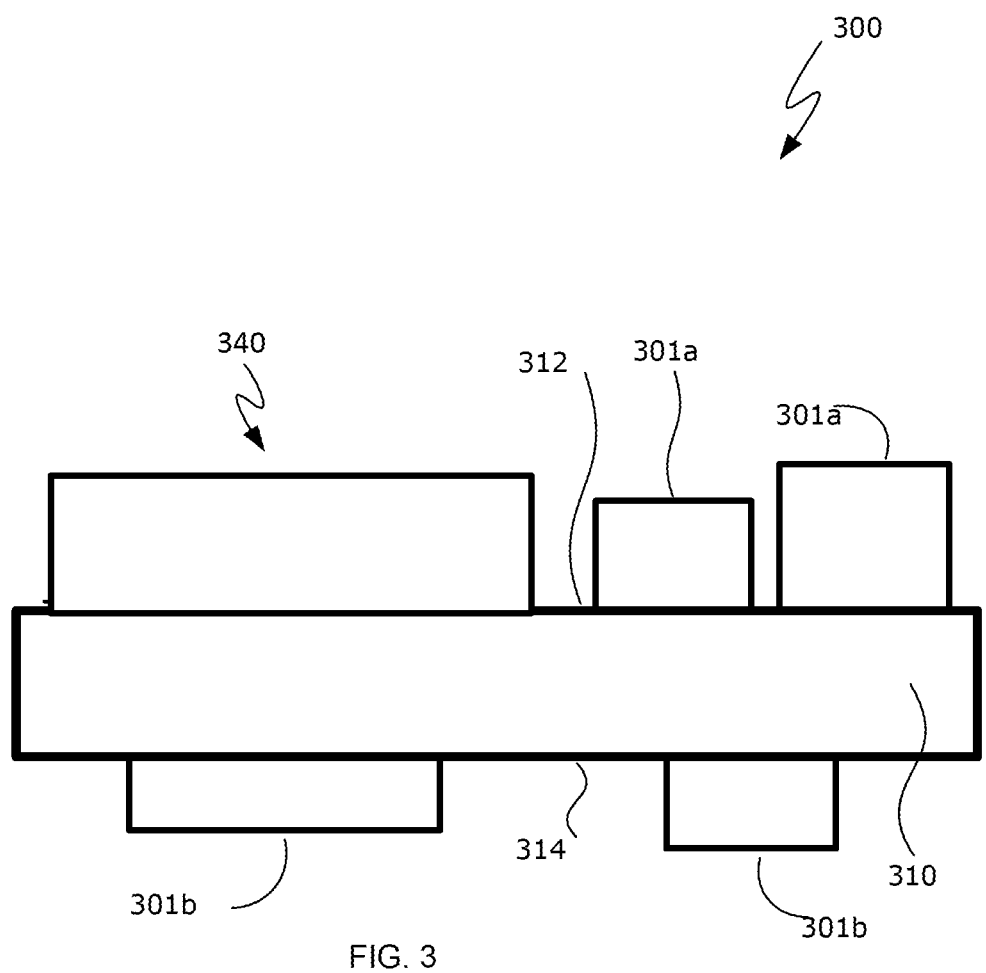
FIG. 3 represents a cross-sectional view of a structure according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 disposed on the mainboard's first side 312, wherein the package structure 340 may comprise any of the passive elements, such as the vertical capacitors and vertical resistor structures of the embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
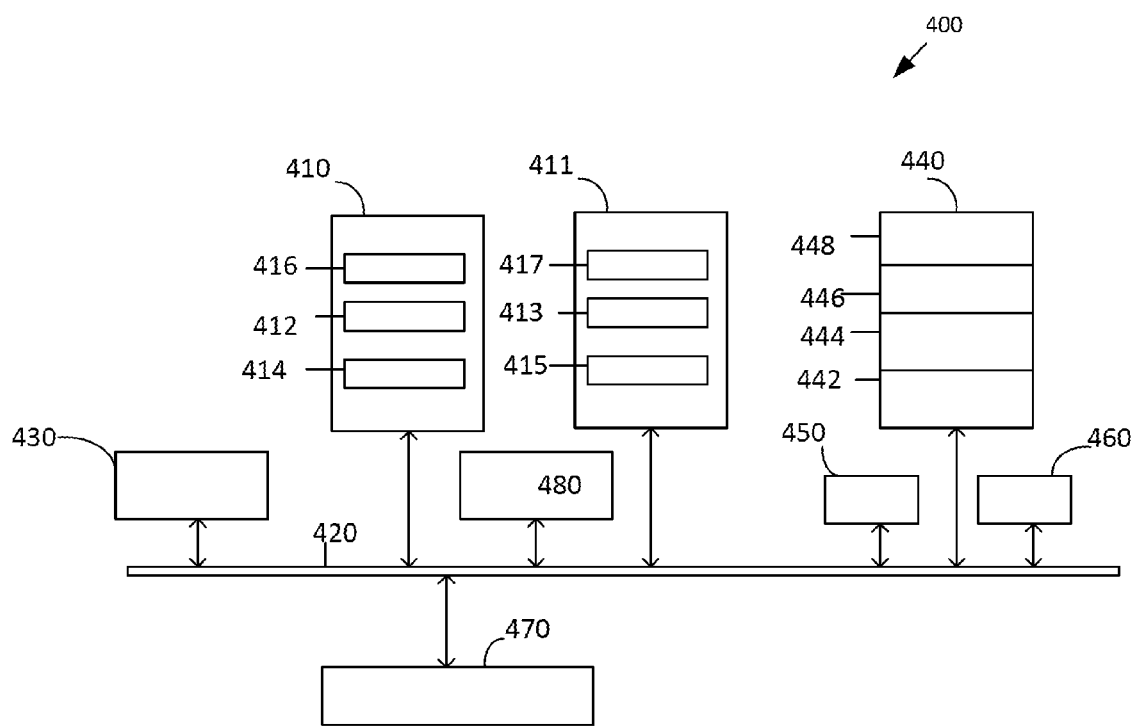
FIG. 4 represents a schematic of a system according to embodiments.

FIG. 4 is a schematic of a computer system 400 according to an embodiment. The computer system 400 (also referred to as the electronic system 400) as depicted can embody/include a package structure that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device structures of the various embodiments included herein. In an embodiment, the integrated circuit 410 includes a processor 412 that can include any type of packaging structures including vertical passive structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a structure comprising:
   forming at least one opening in a substrate, wherein the substrate does not comprise transistors;
   forming a conductive material in the opening;
   forming an insulator material on the conductive material and on the substrate;
   forming a device layer on the insulator material on the conductive material and on the insulator material on the substrate; and
   forming a contact through the insulator material to connect the conductive material to a device disposed in the device layer.

2. The method of claim 1 further comprising wherein the opening comprises a depth of at least about 5 microns.

3. The method of claim 1 further comprising wherein the substrate comprises a bulk silicon region and is disposed below the device layer.

4. The method of claim 1 further comprising wherein a dielectric material is formed to line the conductive material, wherein the dielectric material is disposed between the substrate and the conductive material.

5. The method of claim 1 further comprising wherein the device layer is formed using one of a layer transfer process and a thin film process.

6. The method of claim 1 further comprising forming a resistor material in the substrate adjacent the conductive material.

7. The method of claim 1 further comprising wherein the conductive material comprises a portion of a vertical capacitor structure.

8. The method of claim 1 further comprising wherein the openings are filled with a doped dielectric, wherein the doped dielectric is annealed and dopes the substrate.

9. The method of claim 7 further comprising wherein the vertical capacitor structure further comprises alternating layers of the conductive material and the dielectric material.

10. A method of forming a structure comprising:
    forming a plurality of capacitor structures in a substrate, wherein each of the capacitor structures are vertically disposed in a corresponding trench within the substrate, wherein each of the capacitor structures includes a conductive material, and wherein the conductive material of at least two adjacent capacitor structures are physically joined;
    forming an insulator layer on a top surface of the capacitor structures;
    forming a device layer on the insulator layer; and
    forming a contact to couple a device disposed in the device layer to at least one of the capacitor structures.

11. The method of claim 10 further comprising forming an array of the capacitor structures in the substrate.

12. The method of claim 10 further comprising wherein the contact is formed adjacent a transistor device disposed in the device layer and contacts the at least one capacitor structure through the insulator layer.

13. The method of claim 10 further comprising wherein the contact is formed adjacent a transistor device disposed in the device layer and contacts a region of the substrate adjacent at least one capacitor.

14. The method of claim 10 further comprising wherein the contact comprises a counter electrode for a common ground plane.

15. The method of claim 10 further comprising wherein the substrate comprises a portion of a SOI device, and wherein the substrate does not comprise transistors.

16. A structure comprising:
    a plurality of capacitor structures disposed in a substrate, wherein each of the capacitor structures are vertically disposed in a corresponding trench within the substrate and wherein each of the capacitor structures comprises a conductive material disposed vertically in the substrate and a dielectric material lining a portion of the conductive material and wherein the conductive material of at least two adjacent capacitor structures are physically joined;
    an insulator layer disposed on a top surface of the capacitor structures;
    a device layer disposed on the insulator layer; and
    a contact disposed through the insulator material, wherein the contact couples a device in the device layer with at least one of the capacitor structures.

17. The structure of claim 16 further comprising wherein the contact is adjacent a transistor disposed in the device layer, and directly contacts a top portion of a conductive material of the at lease one capacitor structure.

18. The structure of claim 16 further comprising wherein the at least one capacitor structure comprises a depth of greater than about 5 microns.

19. The structure of claim 16 further comprising wherein the device layer comprises at least one transistor device.

20. The structure of claim 16 further comprising a resistor structure disposed in the substrate and adjacent the at least one capacitor structure.

21. The structure of claim 16 further comprising wherein one end of the contact is disposed adjacent the transistor, and another end of the contact is disposed adjacent the at least one capacitor structure on a portion of the substrate.

22. The structure of claim 16 further comprising a system comprising:
    a bus communicatively coupled to the structure; and
    an eDRAM communicatively coupled to the bus.

* * * * *